United States Patent [19]

Yamazaki

[11] Patent Number: 4,717,602
[45] Date of Patent: Jan. 5, 1988

[54] METHOD FOR PRODUCING SILICON NITRIDE LAYERS

[75] Inventor: Shunpei Yamazaki, Tokyo, Japan

[73] Assignee: Semiconductor Energy Laboratory Co., Ltd., Japan

[21] Appl. No.: 888,645

[22] Filed: Jul. 24, 1986

Related U.S. Application Data

[63] Continuation of Ser. No. 710,110, Mar. 11, 1985, abandoned.

[30] Foreign Application Priority Data

Mar. 12, 1984 [JP] Japan ................................. 59-46838
Oct. 19, 1984 [JP] Japan ................................. 59-220107

[51] Int. Cl.$^4$ .............................................. B05D 3/06
[52] U.S. Cl. ................................. 427/53.1; 427/54.1; 427/55; 427/344
[58] Field of Search ......................... 427/53.1, 54.1, 55, 427/344

[56] References Cited

U.S. PATENT DOCUMENTS

| | | | |
|---|---|---|---|
| 4,181,751 | 1/1980 | Hall et al. ......................... | 427/54.1 |
| 4,461,783 | 7/1984 | Yamazaki et al. ................. | 427/39 |
| 4,485,121 | 11/1984 | Matsumura ....................... | 427/39 |
| 4,495,218 | 1/1985 | Azuma et al. ..................... | 427/54.1 |

*Primary Examiner*—Bernard D. Pianalto
*Attorney, Agent, or Firm*—Gerald J. Ferguson, Jr.; Michael P. Hoffman; Michael J. Foycik, Jr.

[57] ABSTRACT

A silicon nitride layer is formed on a substrate by reacting (1) silicon fluoride, (2) nitrogen or nitrogen hydride and (3) nitrogen fluoride by a chemical vapor deposition method using thermal energy and/or optical energy.

According to the invention process, fluorine is added to the silicon nitride layer to make Si—F bonds, by which the amount of Si—H bonds can be reduced less than 1/10 as compared with that of silicon nitride made by the conventional reaction between $SiH_4$ and $HN_3$. Silicon nitride layer according to the invention will highly enhance the reliability of IC, LSI.

11 Claims, 2 Drawing Figures

METHOD FOR PRODUCING SILICON NITRIDE LAYERS

This application is a continuation of Ser. No. 710,110, filed Mar. 11, 1985, now abandoned.

BACKGROUND OF THE INVENTION

1. Field of the Invention

This invention relates to a method for producing by silicon nitride layer on a substrate by a chemical vapor deposition (CVD) process making use of a thermochemical reaction (low pressure chemical vapor deposition) and a photochemical reaction.

More particularly, this invention relates to a technology for producing a stabilized layer of semiconductor devices, gate insulated layer of IG-FET and insulated layer for capacitors etc.

2. Description of the Prior Art

Conventionally, a silicon nitride layer is produced in such a manner that silane ($SiH_4$) and ammonia ($NH_3$) are reacted by a plasma chemical vapor deposition utilizing a glow discharging to prepare the layer on a substrate of about 200° to 400° C.

Thus formed silicon nitride layer has odd electric charges due to the presence of unpaired couplings of silicon, silicon clusters, OH group etc. left in the matrix. Because of the presence of the electric charge, the silicon nitride could not be applied as a final coating for MOS, IC and so on.

Therefore, in the field of producing a semiconductor device (in particular, EP-ROM), there has been a strong demand for producing a silicon nitride layer in which silicon atoms are hardly clustered.

SUMMARY OF THE INVENTION

An object of the invention is to produce a silicon nitride layer on a substrate by reacting (1) silicon fluoride, (2) nitrogen or nitrogen hydride and (3) nitrogen fluoride by a CVD method (CVD with heat and light).

In accordance with the present invention, fluorine is added to the silicon nitride layer to make Si—F bonds, Si—F . . . H bonds by which the amount of Si—H bonds can be reduced less than 1/10 as compared with that of silicon nitride made by the conventional reaction between $SiH_4$ and $HN_3$. Silicon nitride layer according to the invention will highly enhance the reliability of IC, LSI.

Further, it is possible to reduce a concentration of oxygen in the silicon nitride layer less than 1/10 of oxygen concentration according to the conventional process.

Furthermore, it is possible to make a silicon nitride layer having a surface state density of $3 \times 10^{11}$ cm$^{-2}$ or less.

DESCRIPTION OF THE EMBODIMENTS

Figure 1:
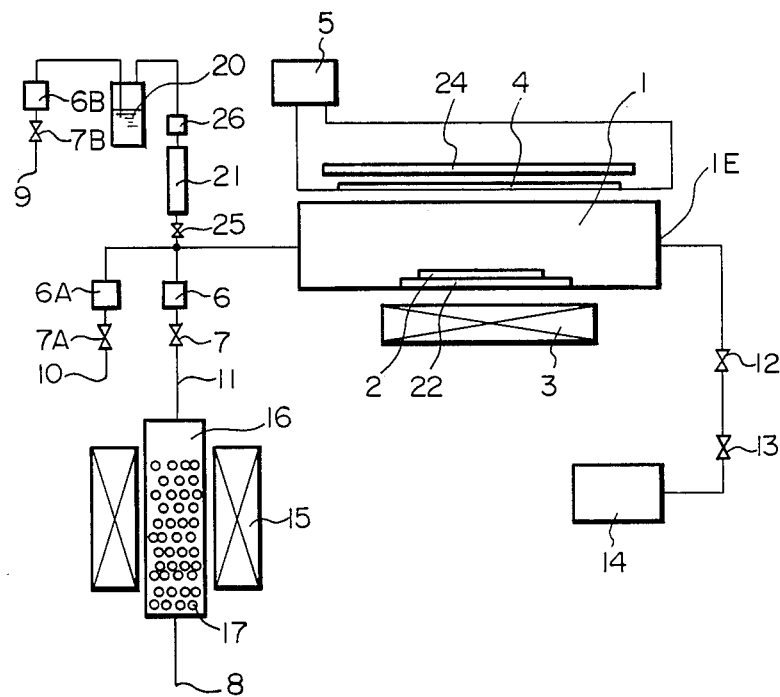
FIG. 1 is a schematic illustration of CVD apparatus of the present invention which is thermally and optically operated.

FIG. 1 illustrates an example of an apparatus for producing a silicon nitride layer on a substrate by a method wherein silicon fluoride ($SiF_x$ (x=2 to 4)) and nitrogen or nitrogen hydride are reactioned chemically under a thermal CVD or photo CVD process.

In FIG. 1, a deposition reactor (vacuum reactor) (1E) is made of quartz. A substrate (2) is attached onto a holder (22) and heated by a heater (3). A heating temperature is 200° to 400° C. (for example, 300° C.). A doping system is composed of flow meters (6), (6A), (6B) and (26) and valves (7), (7A), (7B) and (25), and ammonia is supplied at a point (10) and nitrogen is fed at a point (9), respectively. Since hydrazine ($N_2H_4$)( melting point=1.4° C., boiling point=113.5° C.) is in a liquid state at a room temperature, it is charged in a bubbler (20). As this hydrazine, hydrazine anhydride is used and it is dehumidified and purified by Molecular Sieves (21) so as to have a super-high purity. Silicon fluoride is fed at a point (8) in the form of $SiF_4$, and metalic silicon (17) in the quartz tube (16) (with a purity of 9N or more) is heated by a heater (15) up to 1000° to 1250° C. to produce $SiF_2$ as indicated in the following formula.

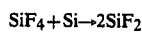

When silicon fluoride is fed in the form of $SiF_2$, it is to be fed from the point (11).

The reaction gas (practically a mixture gas of $SiF_2$ and $SiF_4$) is fed into the deposition reactor (1E) from the point (11). It passes a discharge port, a pressure adjusting valve (12), a stop valve (13) in this order and then it is discharged by a eyhaust pump (14). In order to carry out a photo-chemical reaction, there are arranged a lamp (4) (super high pressure mercury-arc lamp) for producing a light having a wave length less than 300 nm, a reflection plate (24) and its electric energy supplying device (5). Further, the substrate (2) and the heater (3) for heating the holder (22) are arranged below a reaction space (1).

EXAMPLE 1

Silicon nitride layer was made by a thermal CVD process of the reaction between $SiF_4$ and anhydride hydrazine.

In FIG. 1, the silicon substrate (2) is placed in the quartz tube (1E) installed on the heater (3). Further, the valves (7), (7B) and (25) are opened to feed $SiF_2$ and $N_2H_4$ into the system with a ratio of $SiF_2/N_2H_4$ being about 3. The pressure in the deposition reactor (1E) is set in a range of 0.1 to 10 torr (for example, 2 torr). The temperature is 300° C.

In accordance with the CVD process in which the ultraviolet rays having a wave length less than 300 nm, for example, 184 nm and 254 nm (=a resonance wave length of the mercury-arc lamp (24)) are radiated in the deposition reactor (1E), a silicon nitride ($Si_3N_4$) was produced at 1.3 Å/sec.

Its major reaction formula is as follows:

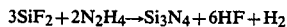

A growth rate of the layer ($Si_3N_4$) was reduced and 0.8 Å/sec. and 0.1 Å/sec. for 1 torr and 0.8 torr, respectively.

Infrared absorption spectrum (IR) revealed that the film (thickness 0.5μ) made by the process described above has a high absorption point at about 900 cm$^{-1}$, which means the layer is silicon nitride.

Further, surprisingly, inspection by the secondary ion microscopic spectroscopy (SIMS/Model 3F of Kameca Co., Ltd. was used) revealed that oxygen concentration in the silicon nitride film according to the invention is quite low and 1 to $5 \times 10^{19}$ cm$^{-3}$, which is less than 1/10 of the oxygen concentration in a silicon nitride made by a conventional plasma CVD process utilizing SiH$_4$ and NH$_3$, considering the conventional silicone nitrides include a considerable amount of oxygen up to 2 to $5 \times 10^{20}$ cm$^{-3}$. The reason may be elucidated as follows. That is, HF is produced as a residual gas after the reaction of SiF$_2$ and N$_2$H$_4$. HF is reacted with SiO$_2$ which is likely to be present as an impurity, and a stable SiF$_4$ is produced following the formula:

$$SiO_2 + 4HF \rightarrow SiF_4 + H_2O$$

Because the water produced by the reaction does not react with SiF$_4$, purification will be completed simultaneously with the formation of the film. On the other hand, in the conventional reaction between silane and ammonia, oxygen may leak into the deposition reactor at a room temperature and react with the residual silane, forming and leaving silicon oxide in the layer, which leads to an increased amount of oxygen contained in the silicon nitride layer.

EXAMPLE 2

A silicon nitride layer was made on a single crystal silicon substrate by using the same apparatus as that of Example 1 by a thermal CVD in which only heat was applied (light was not applied), at a substrate temperature of 800° C. (similar result could be attained under 500° to 1000° C.), a pressure of 2 torr and a ratio of SiF$_2$/NH$_3 \approx 0.3$.

An electrode was made on the silicon nitride (thickness=1000 Å) and C-V characteristic was measured to see a diode structure.

The surface state density was less than $3 \times 10^{11}$ cm$^{-2}$. When DC electric field was applied to the finished silicon nitride layer, a hysteresis characteristic was not observed until the electric field was made to become $1 \times 10^6$ V/cm. It was found that the amount of silicon which mixed into the silicon nitride formed on the silicon substrate was reduced and the charge trap center was decreased.

Figure 2:
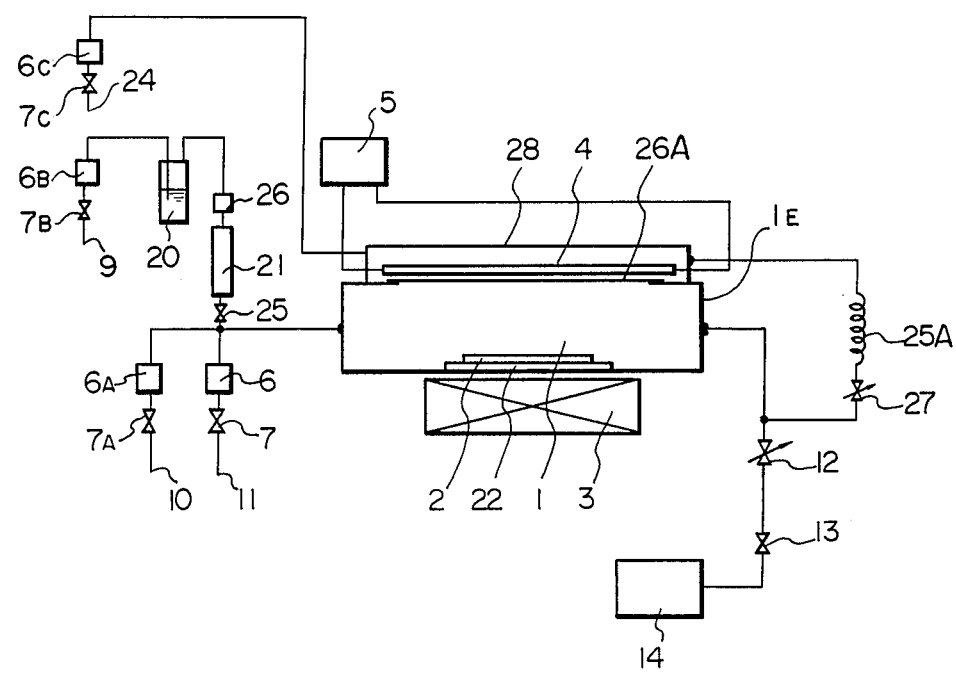
FIG. 2 is a schematic illustration of another CVD apparatus of the present invention which is operated under a presence of heat and light.

FIG. 2 illustrates an example of a device for producing a silicon nitride film by a method wherein silicon fluoride (Si$_n$F$_{2n+2}$ (n=2,3 ... )) and nitrogen, nitrogen hydride or nitrogen fluoride are reactioned chemically under a thermal CVD or photo CVD process.

In FIG. 2, a deposition reactor (vacuum reactor)(1E) is made of quartz. The substrate (2), which is heated by a heater (3), is mounted on the holder (22), and the heating temperature is about 200° to 500° C. (for example, 300° C.). The doping system is composed of flow meters (6), (6A), (6B), (6C) and (26) and valves (7), (7A), (7B), (7C) and (25). Ammonia is supplied at (10) and nitrogen is supplied at (9). Since hydrazine (N$_2$H$_4$) (melting point=1.4° C. and boiling point=113.5° C.) is in a liquid state at a room temperature, it is charged in a bubbler (20). As hydrazine, hydrazine anhydride is used, and it is dehumidified and purified to so as to have super-high purity through Molecular Sieves (21). Silicon fluoride is supplied at (11). As a silicon fluoride, Si$_2$F$_6$ was applied in this case.

The reaction proceeds as follows:

$$3Si_2F_6 + 8NH_3 \rightarrow 2Si_3N_4 + 18HF + 3H_2$$

Similar result may be obtained by use of Si$_3$F$_8$ and Si$_4$F$_{10}$ in place of Si$_2$F$_6$.

The gas passes through the pressure adjusting valve (12) and the stop valve (13), then is discharged by the eyhaust pump (14) from a discharge port. In order to carry out a photo-chemical reaction, sixteen lamps for producing light having a wave length less than mercury-arc lamp, model UL1-45EL2-N-1, made by Ushio Electric Co., Ltd.) (4) and power supply system (5) for them are used. A lamp chamber (28) is connected to the gas discharging system and vacuumized. In order to prevent a back-flow of the reactive gas into the lamp chamber, a certain volume of nitrogen gas is fed from the point (24). Even if the back-flow gas is present, the reactive gas is heated and decomposed at 600° C. by the heater (25A) and the solid component is adhered to the inner wall of the heater (25A). With this arrangement, it is possible to prevent an absorption loss of light having a wave length of 184 nm which is produced between the ultraviolet ray source (4) and the quartz glass (26A) by water vapor etc. come into from the surrounding atmosphere. The lamp chamber (28) is set to have the same pressure as that of the reaction chamber (1) by adjusting the valve (27) so as to prevent a damage of the quartz glass.

EXAMPLE 3

A silicon nitride layer was made in a quartz tube by a photo-chemical reaction between Si$_2$F$_6$ and ammonia.

In FIG. 2, the substrate is heated by a heater (3) up to 300° C. and the silicon substrate (2) for forming silicon nitride is placed on the holder (22) above the heater. The valve (7A) was opened and ammonia was introduced at the point (10). Si$_2$F$_6$ was fed into the system with a ratio of Si$_2$F$_6$/NH$_3$ being about 1/5. The pressure in the reaction container was about 0.1 to 100 torr (for example, 10 torr). The growth rate of the silicon nitride was 1.4 Å/sec (10 torr) under a radiation of ultraviolet rays having peak wave lengthes at 184 nm and 254 nm, respectively. The growing speed of the film was decreased and was 1.1 Å/sec at a pressure of 3 torr.

Infrared absorption spectrum (IR) revealed that the layer (thickness 0.2μ made by the process described above has a high absorption point at about 900 cm$^{-1}$, which means the film is silicon nitride.

Further, surprisingly, inspection by the secondary ion microscopic spectroscopy (SIMS/Model 3F of Kameca Co., Ltd. was used) revealed that oxygen concentration in the silicon nitride layer according to the invention is lower than $4 \times 10^{19}$ cm$^{-3}$, which is less than 1/10 of the oxygen concentration in a silicon nitride made by a conventional plasma CVD process utilizing SiH$_4$ and NH$_3$, considering the conventional silicone nitrides include a considerable amount of oxygen up to 2 to $5 \times 10^{20}$ cm$^{-3}$. The reason for it may be considered as the same as that described in Example 1.

EXAMPLE 4

A silicon nitride layer was formed on a single crystal silicon substrate by using the same apparatus as that of the Example 3 by the thermal CVD in which is applied only heat (light was not applied), at a substrate temperature of 800° C. (similar result may be obtained under 500° to 1000° C.), a pressure of 2 torr, and ratio of Si$_2$F$_6$/NH$_3$ being about ⅕.

An electrode was made on the silicon nitride layer (thickness=1000 Å) to form a diode structure and the interface C-V characteristic was measured. The surface state density was $3 \times 10^{11}$ cm$^{-2}$ or less. When DC electric filed was applied, the hysteresis characteristic was not observed until the field got to $2 \times 10^6$ V/cm.

As described above, the inventive method for producing an insulation layer on the substrate under a reaction of silicon nitride and nitrogen or nitrogen compound gas has been given. The finished insulation layer is superior as a passivation layer, gate insulated layer and insulated film for a capacitor.

Although ultraviolet ray were applied as a light of photo CVD process in the above-mentioned examples 1 to 4, Excimer laser (500 to 100 nm) may also be utilized.

What is claimed is:

1. A method for depositing a silicon nitride comprising:
   supplying a quantity of silicon fluoride gas and a quantity of hydrogen nitride gas to the vicinity of a surface on which the silicon nitride is to be deposited;
   carrying out a chemical reaction between the silicon fluoride and hydrogen nitride, yielding hydrogen fluoride as a by-product in addition to silicon nitride depositing as the product; and
   reacting the hydrogen fluoride with any oxygen containing substance in the product to remove the oxygen from the product.

2. A method for producing a silicon nitride layer as set forth in claim 1, wherein the fluoride gas is $SiF_2$ or $SiF_4$.

3. A method for producing a silicon nitride layer as set forth in claim 1, wherein a thermal energy (500° to 1000° C.) is applied to a reactive gas mixture of silicon fluoride gas including $Si_nF_{2n+2}$ (n=2,3 ...) and a nitride gas.

4. A method for producing a silicon nitride layer as set forth in claim 3, wherein the silicon fluoride gas is $Si_2F_6$ or $Si_3F_8$.

5. A method according to claim 1, wherein said reaction in carried out according to the formula:

$3SiF_2 + 2N_2H_4 \rightarrow Si_3N_4 + 6HF + H_2$

6. A method for producing a silicon nitride layer as set forth in claim 1, wherein a thermal energy and an optical energy having a wave length less than 300 nm is applied to a gas mixture composed of $SiF_2$, ammonia, hydrazine and fluorine nitride.

7. A method according to claim 1, wherein said reaction is carried out according to the formula:

$3Si_2F_6 + 8NH_3 \rightarrow 2Si_3N_4 + 18HF + 3H_2$

8. A method for producing a silicon nitride layer as set forth in claim 1, wherein a thermal energy and an optical energy having a wave length less than 300 nm is applied to a reactive gas mixture composed of $Si_2F_6$ and ammonia, hydrazine or fluorine nitride.

9. A method for producing silicon nitride layer as set forth in claim 6 or claim 8, wherein the optical energy is Excimer laser having a wavelength of 100 to 500 nm.

10. A thermal CVD process for preparing a silicon nitride layer having an oxygen concentration of $5 \times 10^{19}$ cm$^{-3}$ or less, which comprises applying a thermal energy to a reactive mixture of ilicon fluoride gas and hydrogen nitride gas in a reaction chamber containing a substrate to deposit a silicon nitride layer on said substrate and from HF as a by-product; and reacting the HF with any oxygen containing substance in the silicon nitride layer to remove the oxygen from the layer.

11. A photo CVD process for preparing a silicon nitride layer having an oxygen concentration of $5 \times 10^{19}$ cm$^{-3}$ or less, which comprises applying a thermal energy and an optical energy having a wavelength less than 300 nm to a reactive mixture of silicon fluoride gas and hydrogen nitride gas in a reaction chamber containing a substrate to deposit a silicon nitride layer on said substrate and form HF as a by-product; and reacting the HF with any oxygen containing substance in the silicon nitride layer to remove the oxygen from the layer.

* * * * *